(12) United States Patent
Pfeiffer et al.

(10) Patent No.: US 6,928,024 B2
(45) Date of Patent: Aug. 9, 2005

(54) RAM MEMORY CIRCUIT AND METHOD FOR MEMORY OPERATION AT A MULTIPLIED DATA RATE

(75) Inventors: Johann Pfeiffer, Ottobrunn (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/639,379

(22) Filed: Aug. 12, 2003

(65) Prior Publication Data

US 2004/0076040 A1 Apr. 22, 2004

(30) Foreign Application Priority Data

Aug. 12, 2002 (DE) .......................................... 102 36 944
Sep. 14, 2002 (DE) .......................................... 102 42 817

(51) Int. Cl.$^7$ ............................................... G11C 8/00
(52) U.S. Cl. ............................ 365/230.03; 365/189.02; 365/189.5; 365/230.02; 365/233
(58) Field of Search ....................... 365/230.03, 230.02, 365/230.06, 233, 194, 189.02, 189.04, 189.05

(56) References Cited

U.S. PATENT DOCUMENTS

| | | | | |
|---|---|---|---|---|
| 5,111,386 A | * | 5/1992 | Fujishima et al. ........... | 711/118 |
| 5,751,656 A | * | 5/1998 | Schaefer ................... | 365/233.5 |
| 6,101,135 A | * | 8/2000 | Lee ............................ | 365/191 |
| 6,335,901 B1 | * | 1/2002 | Morita et al. ................ | 365/233 |
| 6,556,483 B2 | * | 4/2003 | Ryan et al. ............ | 365/189.04 |
| 2001/0033522 A1 | | 10/2001 | Toda | |

* cited by examiner

*Primary Examiner*—Tan T. Nguyen

(74) *Attorney, Agent, or Firm*—Laurence A. Greenberg; Werner H. Stemer; Ralph E. Locher

(57) ABSTRACT

A RAM memory circuit has at least one memory bank with a multiplicity of memory cells arranged like a matrix in rows and columns and is subdivided into $q \geq 2$ areas, each of which comprises $p \geq 1$ segments each comprising a plurality of columns. Each segment is assigned a bundle of master data lines, which branches from an area bus assigned to the relevant area and, for its part, branches via a switching network to the memory cells of the relevant segment. The area buses can be connected cyclically to a common data port. In order to allow a read operation the beginning of which overlaps the end of a preceding write operation, each master data line bundle has coupled to it a data latch for holding the data respectively appearing there, and an isolating switch is in each case provided between each master data line bundle and the assigned area bus.

10 Claims, 4 Drawing Sheets

RAM MEMORY CIRCUIT AND METHOD FOR MEMORY OPERATION AT A MULTIPLIED DATA RATE

BACKGROUND OF THE INVENTION

Field of the invention

The invention lies in the memory technology field and relates, specifically, to a RAM memory circuit, in particular a dynamic RAM memory circuit (DRAM). The circuit has at least one memory bank, which comprises a multiplicity of memory cells arranged in matrix organization in rows and columns and is subdivided into a plurality of areas which can be cyclically connected to a common data port by way of an area multiplexer.

The RAM memory circuit of the generic type may be described as follows:

At least one memory bank is divided into $q \geq 2$ areas and includes a multiplicity of memory cells in a matrix in rows and columns, the set of the columns of each area being subdivided into $p \geq 2$ disjoint subsets, each of which defines a segment;

For each area there is provided a dedicated area bus and for each segment of each area there is provided a bundle of $m \geq 1$ master data lines which branches from the relevant area bus and, for its part, can be connected via a line network, which can be controlled by address information, to individually addressed groups of in each case m memory cells within a respective segment.

An area multiplexer is enabled to cyclically connect the area buses to a data port, which has m external terminals for inputting and outputting the data groups that are to be written in or read out at the addressed memory cell groups.

Delay or holding means simultaneously provide in each case q successive data groups on the q area buses.

A control device controls the write and read operation under the influence of an applied clock signal and applied address information and command information.

Memory circuits of this generic type allow data streams that are to be written in and read out to be input and output, respectively, via the data port at a data rate which corresponds to a multiple of the internal write clock and read clock at the memory bank. The invention also relates to a method for operating a memory circuit of this type.

The data streams which are input and output at RAM memory circuits may have a width of one or more bits. Thus, in general terms, the data stream is a sequence of "data groups", each of which comprises $m \geq 1$ parallel bits which are input and output via an m-bit parallel port. The term data rate denotes the repetition frequency of the data groups during inputting and outputting. The data are usually handled in so-called data "bursts", i.e. a plurality of directly successive data groups are input or output during each write or read operation. The number of data groups per burst, the so-called "burst length", can be set as a setting parameter at the control device of the memory circuit.

Each data group allocates a group of m memory cells which can be addressed by selection of a row, which is done by activating a row select line (word line) assigned to the row in a manner dependent on a row address (X address), and by selection of a group of m columns in a manner dependent on a column address (Y address). As a result of this row and column addressing, in a controllable data path network covering the memory bank, a data path is switched through which connects the addressed memory cell group to an internal m-bit data bus in order to write an m-bit data group to the addressed memory cell group via the bus, or to read it from the group.

The universal set of the columns of the memory bank is thus organizationally subdivided into disjoint groups of in each case m columns. Larger memory banks are additionally subdivided into a plurality of so-called "segments", each of which comprises an identical number of column groups. Usually, the universal set of the rows is also subdivided into disjoint, equipotent groups. The set of memory cells which belong to the same row group within a segment is referred to as a "domain".

The data path network is constructed hierarchically in accordance with these subdivisions: each domain contains a column line, referred to as "bit line," along each column and there is situated at each memory cell a cell selection switch for optionally connecting the cell to the bit line of the relevant column. For its part, each group of m bit lines belonging to a column group of the domain can be connected selectively via m assigned group selection switches to a bundle of m local data lines which is assigned to the entire domain. For its part, each of these bundles can be connected selectively via m assigned domain selection switches to a bundle of m master data lines which is assigned to the entire segment. Each of these bundles can be connected selectively to the internal m-bit data bus.

With the activation of a word line, selected by the row address, the cell selection switches are closed at all the memory cells of the relevant row. The row address and the column address determine the domain in order to ascertain which domain selection switch is to be closed. In addition, the column address determines which group selection switches within the domain are to be closed and which master data line bundle is to be connected to the internal data bus in order to switch through the data path between the bus and the addressed memory cell group.

The technique of operation at a multiplied data rate as mentioned in the introduction has been customary to a great extent for some time. For instance, published U.S. patent application Ser. No. 2001/0033522 A1, describes a circuit for "double data rate" (DDR) operation. There, the bank is additionally subdivided into two disjoint "areas", each of which comprises one half of the universal set of the columns, to be precise in such a way that each area comprises the same number of whole segments. Each area is assigned a dedicated m-bit data bus as a so-called "area bus". The stream of the data groups to be written in or read out, which are input or output, respectively, as a sequence successively via the data port, is split into two partial streams internally by means of the area multiplexer, in such a way that the successive data groups are alternately assigned to different areas. The two areas are operated synchronously with the same clock timing, so that two data groups are in each case written or read simultaneously (that is to say at the same time), while the inputting and outputting of the sequence of data groups via the data port takes place sequentially (that is to say one after the other with respect to time) at double the frequency of the clock, with correspondingly rapid actuation of the area multiplexer. In order to enable the transition between simultaneous and sequential, either a delay by one period of the data rate (half a period of the access clock) has to be inserted at one of the area buses, or a holding circuit (bus data latch) has to be connected to at least one of the area buses.

In order to realize RAM memories which are to be operated at an even higher data rate, the (for each) memory bank is to be subdivided into correspondingly more disjoint areas, each with the same number of whole segments and with a dedicated area bus. In general terms: for a q-fold data rate (where $q \geq 2$), it is necessary to define q areas and to provide q area buses, and the area multiplexer is to be designed for cyclically changing over the data port between the q area buses. Consequently, in the case of each "access clock" (write or read clock at the bank), q data groups can be written or read at the q areas, the inputting and outputting of the data groups via the data port taking place one after the other with respect to time at a data rate corresponding to q times the frequency of the clock, with correspondingly rapid actuation of the area multiplexer. Hereinafter, a RAM memory circuit of this general generic type shall be designated as qDR-RAM for short.

In order to write data to a RAM bank, in the case of the prior art, an external write command is applied to the memory circuit. In the case of a qDR-RAM, before the beginning of the actual write operation at the bank for switching through the data paths to the respectively addressed memory cell groups after validity of the write command, it is necessary to wait until the first q data groups which can be simultaneously written to the q areas are present in valid fashion on the q area buses. This write start-up time comprises a command evaluation time (setup time), furthermore the bus latency (propagation time of the data from the data port via the multiplexer and the length of the data buses) plus q−1 periods of the data rate. Thus, the sequence of the column select signals which are applied to the switches in the data path network at the frequency of the access clock for switching through the data paths is permitted to be started only after the the start-up time has elapsed. The write operation is ended when the last data group has reached the memory cell group allocated to it, that is to say with the end of the last column select signal. In conventional RAMs, all the area buses are occupied with write data up to this point in time.

In order to read data at the bank, in the case of the prior art, an external read command is applied to the memory circuit, and the sequence of column select signals is begun with the access clock after the command evaluation time has elapsed. Once the first read data group is available at the master data line bundle of the relevant segment with the ending of the first column select signal, the above-mentioned bus latency also elapses before the data group has reached the data port in valid fashion. The total duration from the read command up to this point in time is generally referred to as "CAS latency".

It happens during practical use of RAM memory circuits that it is necessary to change between write and read operation within the same row of memory cells. In the case of qDR-RAMs according to the prior art, each area bus is permanently coupled to all the master data line bundles of the relevant area, usually via bidirectional amplifier circuits, the so-called "secondary amplifiers". Since, as mentioned above, all the area buses are occupied until the end of the last column select signal of a write operation, a subsequent read access cannot be begun until after this point in time. The consequence of this is that the first column select signal of the read access can only be applied at the earliest after one full period of the access clock (q periods of the data rate).

SUMMARY OF THE INVENTION

It is accordingly an object of the invention to provide a novel RAM memory circuit, which overcomes the above-mentioned disadvantages of the heretofore-known devices and methods of this general type and which provides for a qDR-RAM memory circuit that is configured in such a way that a changeover from the write operation to the read operation can be carried out faster than heretofore.

With the foregoing and other objects in view there is provided, in accordance with the invention, a RAM memory circuit, comprising:

at least one memory bank divided into $q \geq 2$ areas and having a multiplicity of memory cells in a matrix of rows and columns, a set of the columns of each area being subdivided into $p \geq 2$ disjoint subsets each defining a segment;

a dedicated area bus for each area and a bundle of $m \geq 1$ master data lines for each the segment of each area, the bundle branching from the respective the area bus and being connectible via a line network, controlled by address information, to individually addressed groups of m memory cells each within a respective the segment;

a data port and an area multiplexer for cyclically connecting the area buses to the data port, the data port having m external terminals for inputting and outputting the data groups to be written in or read out at the addressed the memory cell groups;

delay or holding devices for simultaneously providing in each case q successive data groups on the q area buses;

a control device having a control input for receiving a clock signal and being configured to control a write and read operation under an influence of the clock signal and applied address information and command information;

a data latch coupled to each the master data line bundle for holding a data group respectively appearing at the master data line bundle; and an isolating switch between each master data line bundle and the assigned the area bus, the isolating switch being connected to and controlled by the control device, for temporarily decoupling the master data line bundle from the respective the area bus.

In other words, the invention is realized by a RAM memory circuit containing the following: at least one memory bank, which is subdivided into $q \geq 2$ areas and comprises a multiplicity of memory cells arranged like a matrix in rows and columns, the set of the columns of each area being subdivided into $p \geq 2$ disjoint subsets, each of which defines a segment; for each area a dedicated area bus and for each segment of each area a bundle of $m \geq 1$ master data lines which branches from the relevant area bus and, for its part, can be connected via a line network, which can be controlled by address information, to individually addressed groups of in each case m memory cells within a respective segment; an area multiplexer for cyclically connecting the area buses to a data port, which has m external terminals for inputting and outputting the data groups that are to be written in or read out at the addressed memory cell groups; delay or holding means for simultaneously providing in each case q successive data groups on the q area buses; a control device, which is designed for controlling the write and read operation under the influence of an applied clock signal and applied address information and command information. According to the invention, each master data line bundle has coupled to it a data latch for holding the data group respectively appearing there, there is provided between each master data line bundle and the assigned area bus in each case an isolating switch which can be controlled by the control device, for temporarily decoupling the master data line bundle from the respective area bus.

As long as an isolating switch provided according to the invention is kept closed, that is to say the relevant master data line bundle remains coupled to the area bus, the memory circuit operates in the manner described further above in accordance with the prior art for writing and reading data at the memory bank. If the isolating switch is opened, that is to say the relevant master data line bundle is decoupled from the area bus, the data group which appears last on the bundle is maintained on the bundle owing to the effect of the segment data latch provided according to the invention. This can be utilized in order to begin a read operation in a manner temporally overlapping the end of a write operation, in the manner described below:

As soon as the last q data groups of a write data burst are valid on the q area buses and are transmitted to the master data line bundles via the isolating switches, which are closed up to that point, the isolating switches are opened at precisely those segments to which the last q data groups of the burst are intended to be written. This is followed directly by the column select signal for writing these data groups which are latched by the segment data latches to the addressed memory cell groups of the segments. At the same time, it is possible to apply the column select signal for the reading of the first q data groups (the first "q-tuple") of a data burst to be read out. Consequently, the last q-tuple of the write data groups can be written at the same time as the first q-tuple of the read data groups is read. However, the restriction holds true that this first q-tuple is not permitted to be fetched from the same q segments to which the last q-tuple of the data groups of the previous write data burst are written. With the ending of the simultaneously applied column select signals, the last q-tuple of the write data groups is written in valid fashion, and the first q-tuple of the read data groups is valid on the q area buses. The open isolating switches can be closed again starting from this instant in order to continue the read process in the normal manner, to be precise with no limitation with regard to the choice of segment.

In accordance with an added feature of the invention, the control device comprises:

a row address decoder for selecting a row of memory cell groups depending on a row address;

first and second column address decoders, each connected to receive a column address and activatable to address a memory cell group determined by the respective column address within a selected the row; and a device for optionally activating only the first column address decoder or only the second column address decoder or both the first and second column address decoders simultaneously.

In a preferred embodiment of the invention, each column address decoder in the control device is assigned a dedicated address counter, and the dedicated address counter can be activated in order to supply, at a clock rate of the clock signal, a burst of successive column addresses to the relevant the column address decoder, beginning with a start column address determined by the column address information.

In accordance with an additional feature of the invention, the control device is configured to receive a write command, for starting a write operation, and to receive a read command, for starting a read operation.

In accordance with a further feature of the invention, the control device is configured to receive a write-read command, for starting a write operation and a read operation following directly afterward; and the control device has address terminals for application of a column address simultaneously with a row address or for simultaneous application of two column addresses.

With the above and other objects in view there is also provided, in accordance with the invention, a method for operating the above-outlined RAM memory circuit operating the circuit in a write operation for writing in a burst of successive write data groups received at the data port, and in a subsequent read operation for reading out a burst of successive read data groups to the data port, each data group comprising m data in parallel form and each burst being composed of at least one q-tuple of successive data groups. The method comprises the following steps:

for the write operation, causing the control device to effect the following operations:
  a) changing over the area multiplexer at q times a frequency of the clock signal to send, within a respective clock period, the q write data groups of a respective q-tuple from the data port to the q different area buses;
  b) from a time when a first q-tuple of write data groups is ready on the q area buses, switching through in each case simultaneously and temporarily q write data paths successively at intervals equal to the clock period, for connecting q addressed memory cell groups in the q different areas to the master data line bundles of the assigned segments; and
  c) after a last q-tuple of write data groups is ready on the q area buses and before switching-through the last q write data paths, opening the isolating switches at the respective master data line bundles for the duration of this switching-through, for the read operation, causing the control device to effect the following operations:
  d) from a time when the isolating switches are opened, switching through in each case simultaneously and temporarily q read data paths successively at intervals equal to the clock period, for connecting q addressed memory cell groups in the q different areas to the master data line bundles of the assigned segments;
  e) as soon as the first q-tuple of data groups read out via the read data paths is ready at the area multiplexer, changing over the area multiplexer at q times the frequency of the clock signal for passing the q data groups of each q-tuple to the data port successively at intervals equal to a $q^{th}$ of the clock period;

addressing memory cell groups lying in different segments than the q memory cell groups addressed last in the write operation for reading out the first q-tuple of read data groups.

In accordance with again an added feature of the invention, the method is to be performed with a RAM memory circuit the control device of which is configured to receive a write command, for initiation of the write operation, and to receive a read command for initiation of a read operation. The method thus comprises:

providing the row address prior to the initiation of the write operation;

for the initiation of the write operation, applying the write command and providing the column address for the first q-tuple of write data groups; and for the initiation of the read operation, applying the read command and providing the column address for the first q-tuple of read data groups.

In accordance with again an additional feature of the invention, the method is to be performed with a RAM memory circuit the control device of which is configured to receive a write-read command for starting a write operation and a read operation following directly afterward, and the control device has address terminals for application of a column address simultaneously with a row address or for simultaneous application of two column addresses. The corresponding method comprises the following steps:

providing the row address before an initiation of the write operation;

for the initiation of the write operation, applying the write-read command;

providing one of the start column addresses for the write-read operation upon the initiation of the write operation and providing another one of the start column addresses likewise upon the initiation of the write operation or together with the row address.

In accordance with again another feature of the invention, the start column address for the write operation is provided together with the start column address for the read operation.

In accordance with a concomitant feature of the invention, the start column address for the write operation is provided together with the row address.

Other features which are considered as characteristic for the invention are set forth in the appended claims.

Although the invention is illustrated and described herein as embodied in a RAM memory circuit and method for a memory operation at a multiplied data rate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
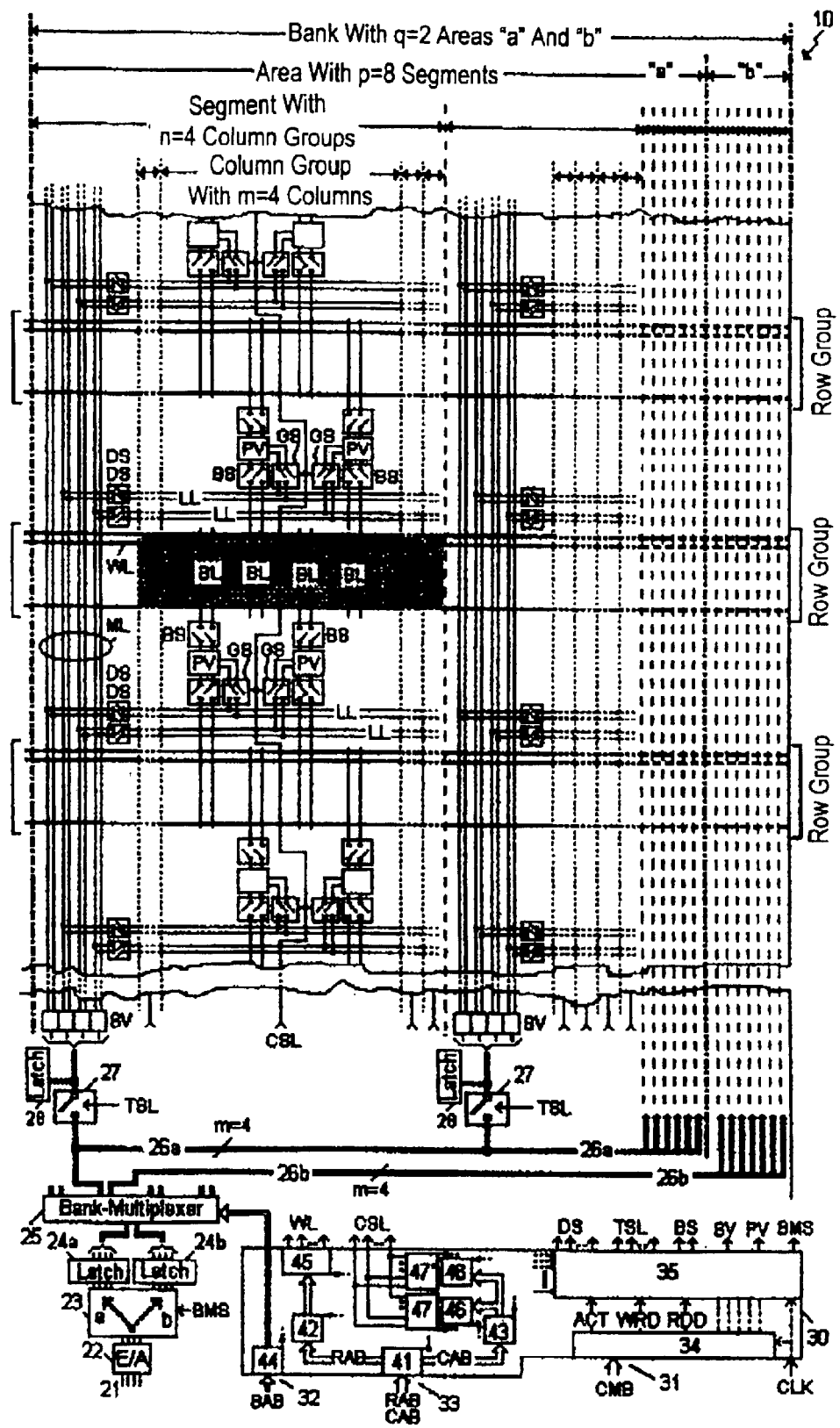
FIG. 1 is a circuit schematic of a qDR-RAM memory circuit according to the invention for the example q=2.

Referring now to the figures of the drawing in detail and first, particularly, to FIG. 1 thereof, there is shown in the upper part thereof, in schematic and fragmentary fashion, the customary construction of a RAM memory bank, which is designated in its entirety by 10. The bank 10 contains a large multiplicity of binary memory cells arranged in a matrix in rows and columns. Extending over the bank 10 there is a network of control and data lines with diverse switches and amplifiers in order to selectively access selectable memory cells. Thus, a row select line WL, designated as a "word line", runs along each row. The word lines are represented as thick horizontal lines in FIG. 1.

In the case shown, the set of the rows is subdivided into a plurality of disjoint groups, each of these row groups containing the same number of rows. Within each row group, there extends along each column a two-core column select line BL, which is referred to as "bit line" and is usually formed with two cores. These bit lines BL are represented as vertical line pairs within the row groups in FIG. 1. The memory cells are situated near the crossovers of the word and bit lines; they can be connected to the relevant bit line BL via the cell selection switches, which are closed by activation of the relevant word line WL.

In each case m adjacent columns of the bank 10 form a "column group", and in each case n adjacent column groups form a "segment". In each case p adjacent segments define one of a total of q "areas" of the bank 10. In the case shown, m=4, n=4, p=8 and q=2. In FIG. 1, the boundaries of the column groups are indicated by dotted vertical lines, the boundaries of the segments are indicated by dashed vertical lines, and the boundaries of the areas are indicated by dash-dotted vertical lines. For space reasons, only one column group within a segment is depicted in detail, namely the second column group of the first segment from the left. The rest of the bank is represented only by indication by means of the respective boundary lines.

The above-described subdivision of the bank 10 results in individual "domains", each defined by the intersection set of the memory cells of a row group with the memory cells of a segment. One of these domains is highlighted by shading in FIG. 1. Each domain is assigned a group of m=4 two-core local data lines LL.

Each bit line can be connected via a bit line selection switch BS to a differential amplifier which functions like a bidirectional 1-bit latch and is referred to here as "primary amplifier" PV. In each case m=4 primary amplifiers PV form a group which is respectively assigned to a column group and can be connected via m=4 group selection switches GS to the four local data lines LL. In the case shown, the primary amplifiers PV and the local data lines LL are arranged in strips on both sides of the row groups, adjacent row groups in part being assigned the same primary amplifiers and local data lines. The bit line selection switches BS ensure that the primary amplifiers and local data lines are connected to bit lines only of the respectively addressed row group. All group selection switches GS which belong to the same column group in each case are controlled via a common column select control line CSL.

Each segment has a dedicated bundle of m=4 two-core master data lines ML. Each group of four of the local data lines LL which can be assigned to a domain can be connected via domain selection switches DS to the master data line bundle ML of the relevant segment. On the other side, each master data line bundle ML is connected to a group of m=4 bidirectional differential amplifiers, which are referred to as "secondary amplifiers" SV. In the case shown, said secondary amplifiers SV are symmetrical on the side of the two-core master data lines and asymmetrical on the other side. The asymmetrical side of each secondary amplifier group SV is connected to an m-bit latch 28, designated as "segment data latch" hereinafter.

Each of the q=2 areas of the bank 10 is assigned a dedicated area bus 26a and 26b, respectively, designed as an m-bit parallel bus, that is to say as a 4-bit parallel bus in the case shown. Each area bus 26a, 26b has branches to all the secondary amplifier groups SV of the respectively assigned area of the bank 10. An isolating switch 27 is provided between each bus branch and the relevant secondary amplifier group SV.

For the inputting and outputting of data groups which in each case comprise m=4 parallel bits, a bidirectional I/O data port 22 is provided, which is connected to m data terminals 21 of the memory circuit and is designed as an m-bit parallel port. The data port 22 can optionally be connected to one or the other of the two area buses 26a, 26b via an area multiplexer 23, which is controlled by a control signal BMS. Each of these connections runs via a bidirectional m-bit latch 24a or 24b, respectively, designated as "bus data latch" hereinafter, and a bank multiplexer 25, which selects either the two area buses 26a and 26b of the bank 10 or the two area buses of another bank of the same type, in a manner dependent on bank address bits BAB. A RAM memory circuit usually contains four banks of this type.

The activation signals for the word lines WL and for the column select control lines CSL and the primary and secondary amplifiers PV and SV, the control signals for the domain selection switches DS and isolating switches 27 and the control signal BMS for the area multiplexer 23 are generated by a control signal transmitter 35 within a control device 30, to be precise in a controlled sequence and in temporal reference with respect to the edges of a clock signal CLK comprising pulses with a repetition frequency f (clock frequency) and a duty ratio of 50%. In addition to an input for the clock signal CLK, the control device 30 has an input 31 for command bits CMB, an input 32 for address bits BAB for the selection of the bank (bank address bits) and an address input 33 for address bits RAB for the selection of the row (row address bits) and address bits CAB for the selection of the column group (column address bits). The command bits CMB are decoded within the control device 30 by means of a command decoder 34 and applied to the control signal transmitter 35.

As is customary in conventional dynamic RAMS, the address input 33 for the row and column address bits RAB and CAB is dimensioned, with regard to the bit width, such that the row address information and the column address information have to be applied one after the other (address multiplex). Therefore, an address demultiplexer 41 is provided in the control device 30 in order to transmit row address bits RAB received at the input 33 into a row address buffer 42 and received column address bits CAB into a column address buffer 43. Preferably, provision is also made of a buffer 44 for the bank address bits BAB received at the input 32. The address buffers 42, 43, 44 form temporary stores, e.g. in the form of scannable address latches, in order to keep the address bits RAB, CAB and BAB ready for retrieval.

FIG. 1 shows further constituent parts of the control device 30 in the form of a row address decoder 45, a first column address decoder 47, a second column address decoder 47', a first address counter 46 and a second address counter 46'. Upon being activated, the row address decoder 45 decodes the row address bits RAB kept ready in the row address buffer 42 in order to generate the activation signal for the word line WL of a selected row. Each address counter 46, 46' can be activated separately in order to retrieve the column address kept ready in the column address buffer 43 as a start address Y1 or Y'1, respectively, and, beginning with this start address, to apply a burst of successive column addresses Y1, Y2 . . . or Y'1, Y'2, . . . , respectively, to the assigned column address decoder 47 or 47', respectively, to be precise at the rate of the clock signal CLK. The column address decoders 47 and 47' decode the respectively applied column addresses in order to activate the column select control lines CSL for the column group selection.

The control signal transmitter 35 is networked within the control device 30 via a multiplicity of connections to the above-described elements 41 to 47', in order, on the one hand, to control the operation of these elements and, on the other hand, to generate the control and activation signals for the switches DS, TSL, BS and the amplifiers SV, PV not only in a clock-controlled manner but also in a manner dependent on the address information. These connections are not illustrated for reasons of clarity; their existence is indicated merely by depicted terminal symbols.

The text below will describe, with reference to the timing diagram according to FIG. 2, how the RAM memory circuit illustrated in FIG. 1 can be operated by means of the control device 30 for writing in a data burst and subsequently reading out a data burst at the bank 10, to be precise for the case of a burst length r=4.

Before the beginning of operation, all the selection switches in the line network of the bank 10 are open, all the isolating switches 27 are closed, and all the primary amplifiers PV and secondary amplifiers SV are deactivated. At an instant t1a, the command bits for an activation command ACT are applied with the rising edge of the clock signal CLK. At the same time, the row address bits RAB for the selection of a row $X_i$ are applied to the address input 33, the address demultiplexer 41 being set in such a way that said address bits are transmitted into the row address buffer 42, from where they pass to the row address decoder 45. Likewise at the same time t1a, the bank address bits BAB for selection of the memory bank 10 are applied to the address input 32.

After the evaluation time Ts (setup time) has elapsed, which is required for the decoding of the activation command and the evaluation thereof, the row address is also decoded, and the word line WL of the addressed row $X_i$ is activated. The word line thereby begins to rise from low potential to high activation potential, which is reached after a charging time Tc has elapsed. As a result of this, the cell selection switches (not shown in FIG. 1) are closed at all the memory cells of the addressed row, so that precisely these memory cells are connected to the assigned bit lines BL in the relevant row group. Approximately at the same time, all the primary amplifiers PV are activated, and the bit line selection switches BS at the bit lines of the cell group and the domain selection switches are closed by control signals derived from the row address. In the case shown, the total time Ts+Tc lasts somewhat less than 2T, where T=1/f is the period duration of the clock signal CLK.

With the subsequent rising CLK edge at the instant t3a, the command bits CMB for a write command WRD (write data) are applied to the command input 31, and, at the same time, the address bits CAB for a column start address Y1 are applied to the address input 33. In this case, the address demultiplexer 41 is set in such a way that it transmits said address bits to the column address buffer 43, where they are held for retrieval. After the command evaluation time Ts has elapsed, the first data group D1a at the data port 21 is sampled with the rising CLK edge that then follows at the instant t4a, the area multiplexer 23 being set to its a position by the signal BMS. As a result of this, the first data group D1a is transmitted into the bus data latch 24a and (via the bank multiplexer 25 set to the bank 10) to the area bus 26a of the bank 10. With the falling CLK edge that follows at the instant t4b, the second data group D1b at the data port 21 is sampled and the area multiplexer 23 is switched to the b position. As a result of this, the second data group D1b is transmitted into the bus data latch 24b and to the area bus 26b of the bank 10. In a similar manner, the third data group D2a is transmitted into the bus data latch 24a and to the area bus 26a with the next rising CLK edge (instant t5a) and the fourth data group D2b is transmitted into the bus data latch 24b and to the area bus 26b with the next falling CLK edge (instant t5b).

A time period Tb (bus latency) elapses from the sampling of a data group at the data port 21 up to the validity of the data on the allocated area bus 26a or 26b, respectively. Since successive data groups at the data port 21 are sampled at a data rate of 2f, that is to say at intervals of T/2, overall a time period Tb+1T/2 elapses from the sampling of the first data group D1a until the first q-tuple of the data groups, that is to say the first data group pair D1a, D1b in the case shown of q=2, has collected on the two area buses 26a and 26b and these data groups have thus also passed (via the closed isolating switches 27) to the secondary amplifier groups SV in the two bank areas a and b, where they are held by the segment data latches 28.

It is only at this instant (t5b in the case illustrated) that the simultaneous writing in of the two first data groups D1a and D1b at the memory cell groups determined by the row address $X_i$ and the start address Y1 in the two areas of the bank 10 can begin. For this purpose, the secondary amplifiers SV are activated, and a first column select signal is generated, which has the effect of activating, in the two bank areas, precisely that column select control line CSL-Y1 which leads to the group selection switches GS of the addressed column group, so that precisely these switches are closed. The column select control line CSL-Y1 is activated by virtue of the fact that the first address counter 46 and the first column address decoder 47 are activated in good time beforehand in order to accept the start address Y1 held in the column address buffer 43 into the address counter 46 and to decode it by the column address decoder 47.

Activation of the column select control line CSL-Y1 closes the data path from each area bus 26a or 26b, respectively, to the selected memory cell group in the respectively assigned bank area, so that the writing in of the data group D1a in the a area takes place at the same time as the writing in of the data group D1b in the b area. One clock period T later, that is to say at the instant t6b, the next two data groups D2a and D2b are ready simultaneously on the area buses 26a and 26b and also on the master data line bundles ML in order to be written in simultaneously at other memory cell groups of the two bank areas. This writing in is effected in the same way as described above for the data groups D1a and D1b, the memory cell group in each bank area being selected by activation of a column select control line CSL-Y2, which is determined by a new column address Y2. The new column address Y2 is generated by advancing the address counter 46.

In the example considered here, the data group D2b is the last data group of the write data burst before the desired changeover to read operation. Therefore, at an instant ts1, at which this data group has reached the segment data latches 28 of the b bank area, the isolating switches 27 are opened at precisely those two segments at which the last two data groups D2a and D2b are intended to be written in. This is done by activation of the control lines TSL of precisely these isolating switches 27, selected by the last column address Y2 of the write operation.

Despite the opening of said isolating switches 27, the last write data groups D2a and D2b are written in upon subsequent activation of the column select control line CSL-Y2 in both bank areas, since they remain available in the segment data latches 28. On the other hand, starting from the opening instant ts1 of said isolating switches 27, the area buses 26a and 26b can already take up the first two data groups D'1a and D'1b of a subsequent read data burst, without conflicting with the last two write data groups D2a and D2b. The only condition, as stated, is that the first two read data groups are not fetched from the same segments at which the last two write data groups are intended to be written in.

Figure 2:
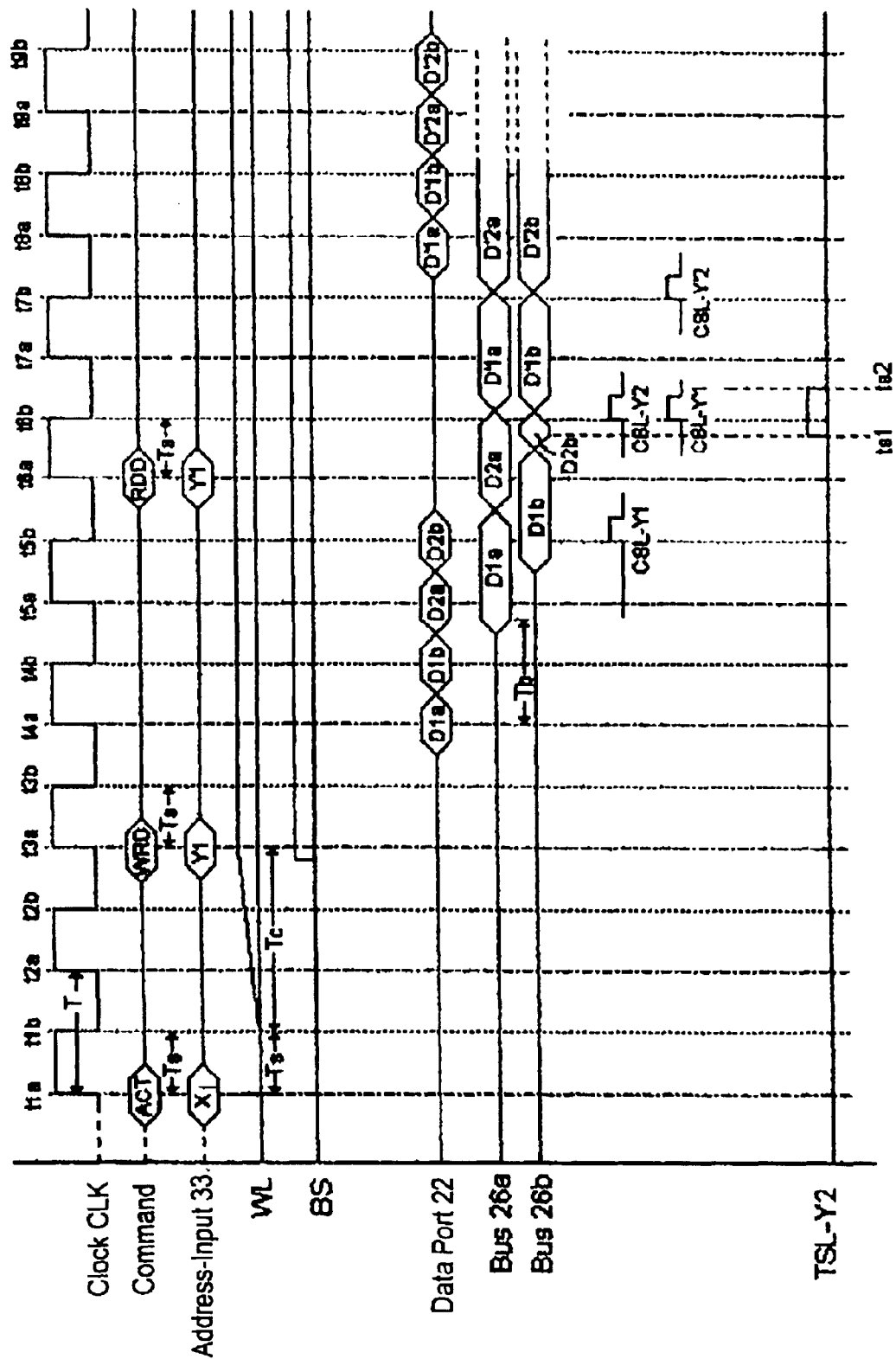
FIG. 2 is a timing diagram illustrating the operation of the memory circuit according to FIG. 1 in the event of a changeover from writing to reading.

Consequently, as shown in FIG. 2, at the same time as the column select control line CSL-Y2, at the instant t6b, a column select control line CSL-Y'1 is also activated, which is determined by the address Y'1 of the first two read data groups D'1a and D'1b. In order to make this possible, in accordance with FIG. 2, a read command RDD (read data) and the bits of the start address Y'1 of the read operation are applied earlier by at least the evaluation time Ts (at the instant t6a in the case shown) than the activation of the column select control lines CSL-Y'1 for the first read data group D'1a is detected. The start address Y'1 of the read operation which is applied to the address input is transmitted into the column address buffer 43, where it replaces the address Y1, and is accepted into the second address counter 46' by activation of the latter. At the same time, the second column address decoder 47' is activated in order to decode the accepted start address Y'1 and thereby to activate the column select control lines CSL-Y'1.

As a result, these two read data groups run from the memory cell groups addressed by Y'1 to the area buses 26a and 26b, and, at the same time, the last two write data groups D2a and D2b run from the segment data latches 28 to the memory cell groups addressed by Y2. Afterward, CSL-Y2 and CSL-Y'1 are deactivated again and the previously opened isolating switches 27 are closed again at the earliest at that point. The first address counter 46 and the first column address decoder 47 are deactivated.

The second address counter 46' and the second column address decoder 47' remain active, however, in order to generate and decode the next column address Y'2 for the read operation. Consequently, one clock period T after the simultaneous activation of CSL-Y2 and CSL-Y'1, that is to say at the instant t7b, for example, in both bank areas the column select control line CSL-Y'2 is in each case activated for the two data groups D'2a and D'2b to be read out next, so that these two data groups reach the area buses 26a and 26b. The previously opened isolating switches must be closed again at the latest at the beginning of this activation. Each q-tuple of data groups, that is to say each of the pairs D'1a, D'1b and D'2a, D'2b in the case shown where q=2, is held by the assigned bus data latch 24a and 24b, respectively, in order that the two simultaneously read data groups of the pair can be passed to the data port 22 one after the other at the interval T/2 under the control of the area multiplexer 23. Consequently, the data rate of the read data that are output is equal to double the clock frequency. The time period between the application of the read command RDD and the validity of the first read data group at the data port 22 is referred to as "CAS latency".

As shown in FIG. 2, a delay arises, of course, between each CSL activation and the arrival of the read data thereby selected at the data port. This delay corresponds approximately to the abovementioned bus latency Tc plus a delay time which may be required to produce synchronism between the read data appearing at the data port 22 and the rising and falling clock edges. In the case shown, the first read data group D'1a can be sampled at the data port 22 with the rising clock edge at the instant t8a, the second group D1'b with the falling clock edge at the instant t8b, etc.

The controller (not shown) which sends the command and address bits and the data to the memory circuit "knows" the burst length and also "knows" whether a write data burst is to be followed by a read data burst. Consequently, the controller is able to send the read command RDD and also the data in good time for the overlapping reading.

In an alternative embodiment, the RAM memory circuit may be provided with a control device which is modified with respect to FIG. 1 and is able to identify and process a particular command comprising the instruction "write data and then read data". If the read-out of a data burst overlapping the writing in of a data burst is desired, such a "write-read command" WDRD can already be applied for initiating the write operation instead of the conventional write command WRD. As a result, the control device "finds out" in good time that it is to generate the column select control signal of the first read data group at the same time as the column select control signal for the last write data group, so that the external application of the read command RDD is no longer necessary.

Figure 3:
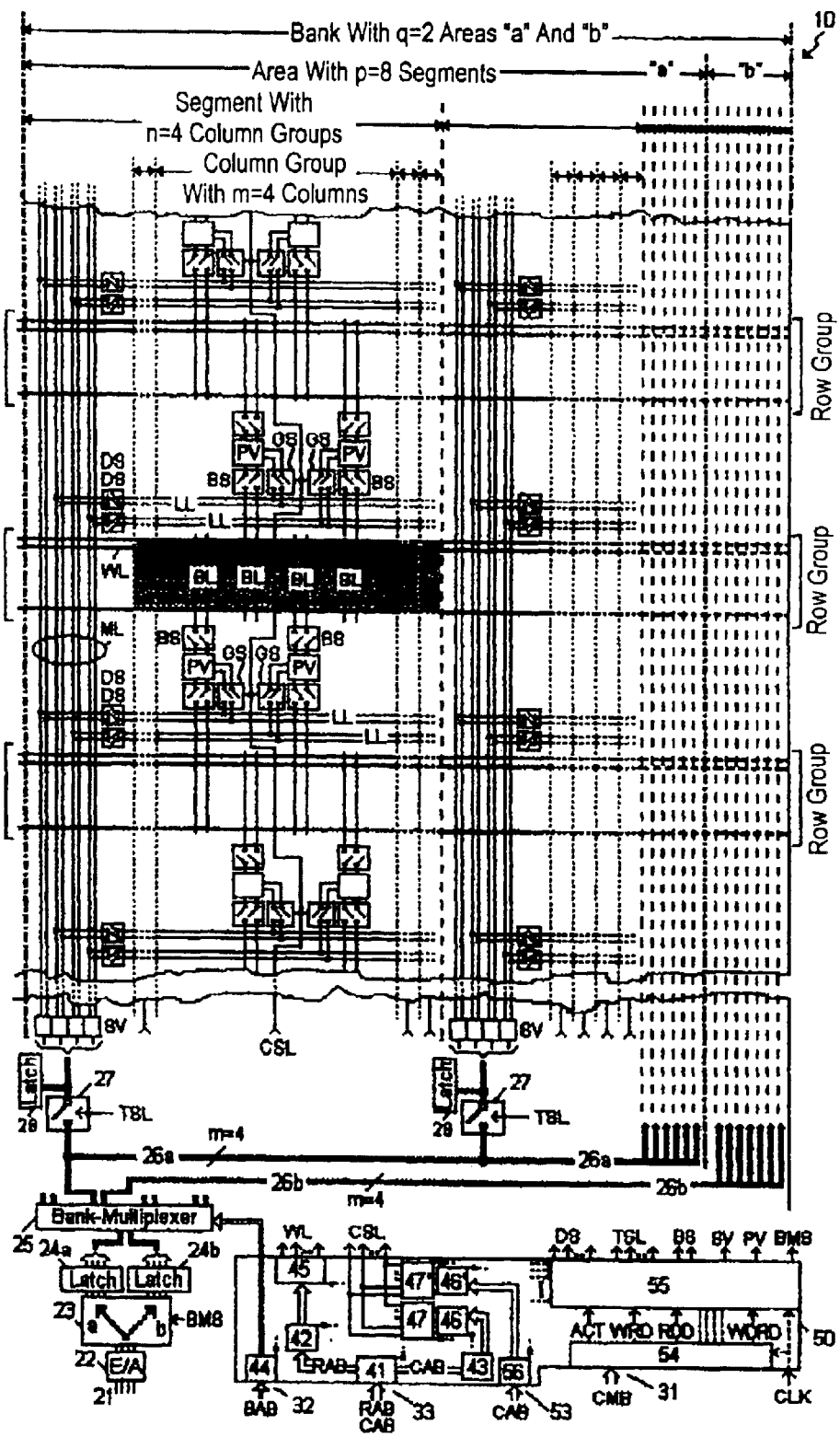
FIG. 3 is a circuit schematic of a variant of the memory circuit according to FIG. 1 with a somewhat modified embodiment of the control device.

However, for this case, particular measures are preferably to be taken in order to apply the start column address Y'1 for the read operation early enough. One possibility is to dimension the total bit width of the address terminals at the memory circuit with a magnitude such that at least two addresses can be applied simultaneously, e.g. the start column address Y'1 for the read operation simultaneously with the start column address Y1 for the write operation or one of the two start column addresses simultaneously with the row address. This can even be realized without significantly enlarging the space requirement, by using so-called ball grid arrays, in which, in contrast to the currently predominant TSOP memory housings (which have contact regions only at the sides), the entire housing underside is occupied by contacts, so that a larger number of contacts can be accommodated. FIG. 3 illustrates a corresponding design of a RAM memory circuit according to the invention.

The RAM memory circuit according to FIG. 3 differs from the embodiment according to FIG. 1 only in the design of the address terminals for the column and row address bits and in a few features of the control device, which is designated in its entirety by the reference numeral 50 in FIG. 3. In addition to the address input 33, which, as in the case of FIG. 1, serves for receiving row and column address bits RAB and CAB in multiplex, a further address input 53 is provided, which serves for receiving address bits CAB for a second column address simultaneously with the column address bits at the input 33 and for transmitting the second column address into a second column address buffer 56, which, for its part, is connected to the second address counter 46'. The first address counter 46 is connected to the column address buffer 43.

The command decoder 54 of the control device 50 is designed in such a way that it can identify and decode the above-mentioned write-read command WDRD, in order to condition the control signal transmitter 55 of the control device 50 for carrying out the overlapped write and read operation. All the other elements and terminals of the control device 50 correspond in terms of their construction and their functioning to those of the control device 30 according to FIG. 1 and are designated by the same reference numerals as in FIG. 1.

Figure 4:
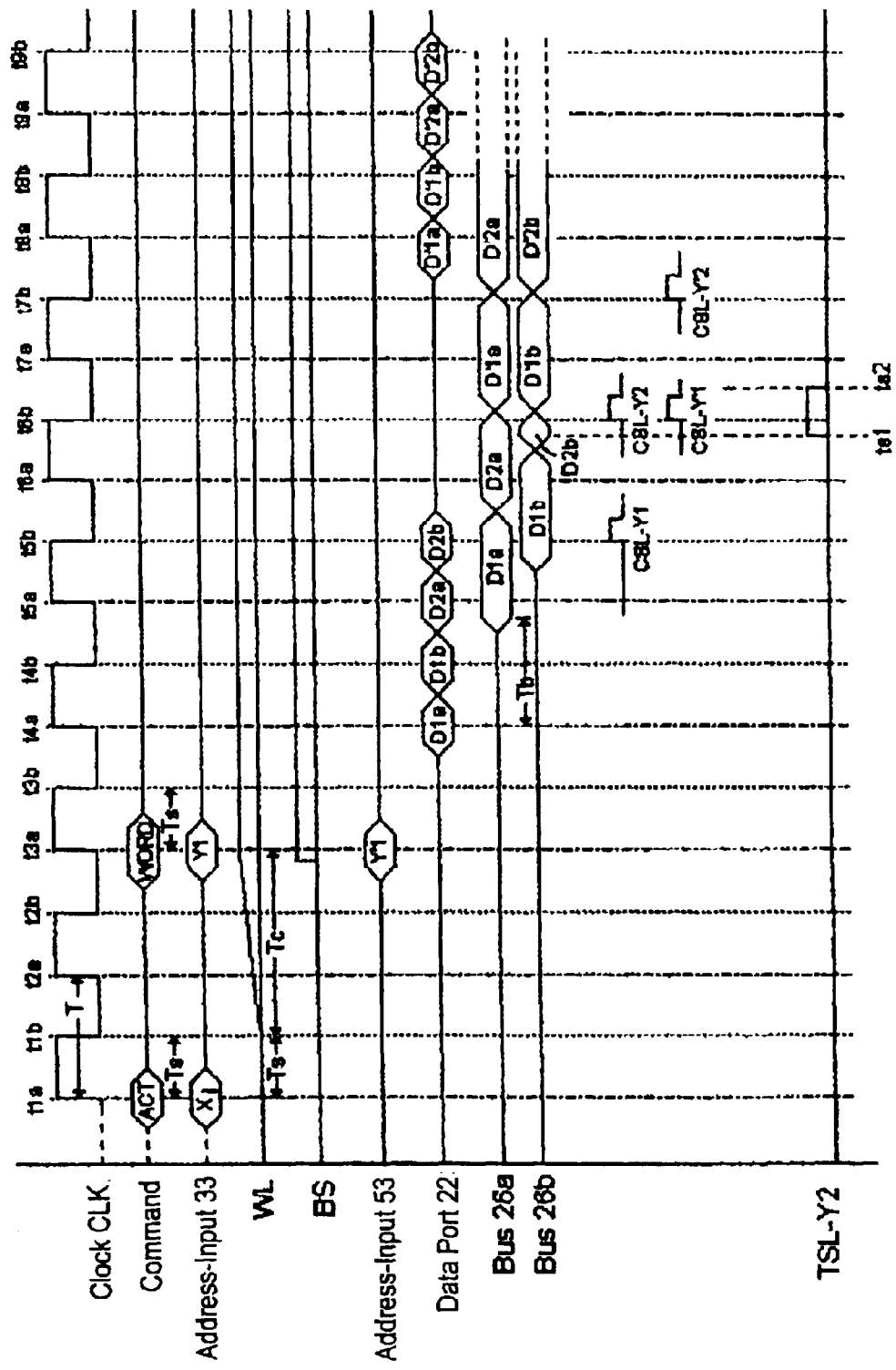
FIG. 4 is a timing diagram for illustrating the operation of the memory circuit according to FIG. 3 in the event of a changeover from writing to reading.

The write and read operation of the memory circuit according to FIG. 3 is illustrated in the timing diagram of FIG. 4 and differs only slightly from the operation of the memory circuit according to FIG. 1 described above with reference to FIG. 2. Therefore, it suffices merely to discuss the differences:

After the activation command ACT has been applied to the command input CMB and the row address $X_i$ has been applied to the address input 33 at the instant t1a, the write-read command WDRD is applied at the instant t3a. At the same time, the start column address Y1 for the subsequent write operation is applied to the address input 33 and the start column address Y'1 for the later read operation is applied to the address input 53. The address Y1 is buffer-stored in the first column address buffer 43, and the address Y'1 is buffer-stored in the second column address buffer 56.

This is followed by the writing of the data groups D1a, D1b, D2a, D2b, beginning with the start address Y1 that is ready in the buffer 43 using the first address counter 46 and the first column address decoder 47, and the reading of the data groups D'1a, D'1b, D'2a, D'2b which commences in overlapping fashion, beginning with the start address Y'1 that is ready in the buffer 53 using the second address counter 46' and the second column address decoder 47', as has been described further above in connection with FIG. 2, but without the application of a separate read command RDD. Instead of an external read command RDD, it is possible to use a signal which is generated internally by the control signal transmitter 55 directly after the first address counter 46 has generated the penultimate write data column address. The number of write data column addresses that are to be generated successively is known from the outset since it depends on the burst length r set; it amounts to r/q.

During the operation described above with reference to FIG. 4, the row address $X_i$ and the start column address Y1 for the write operation are applied successively to the same address input 33 and forwarded selectively by means of the address demultiplexer 41 to the row and column address buffer 42 and 43 respectively responsible, while the start column address Y'1 for the read operation is applied to the additional address input 53 and fed to the additional column address buffer 56. Of course, other schemes are also possible in order to utilize the two address inputs 33 and 53 for applying the three addresses $X_1$, Y1 and Y'1. As an alternative, e.g. the start column address Y1 for the write operation may be applied to the additional address input 53, to be precise at the instant t1a simultaneously with the row address $X_i$ at the address input 33; only afterward is the start column address Y'1 for the read operation applied to the address input 33. This alternative has the advantage that all the items of information for the beginning of the write operation are already present at the same time as the activation command ACT and the write operation can thus be initiated significantly earlier than is shown in FIG. 4. This is because, for the initiation of a write operation, it is not absolutely necessary to wait for the entire charging time Tc of the word line.

The figures merely illustrate exemplary embodiments. Further deviations in some details or other variants are possible, of course, within the scope of the concept of the invention. Thus, the domain selection switches DS may, if desired, be closed in isolated fashion only for the respectively addressed segment depending on the Y address, instead of altogether at all the segments. The coupling of the segment data latches 28 to the master data line bundles ML can also be effected by direct connection to said bundles, instead of the coupling on the other side of the secondary amplifiers SV as shown. The same applies to the location of the isolating switches 27.

The values q=2, p=8, n=4 and m=4 and the burst length r=4 are only examples. Burst lengths of r=8 are customary in the operation of RAMs, and the number n of column groups per segment n is usually much greater than 4. Within each of the q areas, both the set of segments and the set of row groups may additionally be divided in each case into two (or more) subsets which are addressed in parallel in order to increase the bit width of the data groups to a multiple of m, with a corresponding increase in the bus width, as known per se in RAMs.

If a plurality of memory banks are present, some elements of the control device 30 or 40 should preferably be provided multiply, in each case separately for each bank. This applies in particular to the groups of address decoders 45, 47, 47', address counters 46, 46' and address buffers 42, 43 (and if appropriate 56). The elements that are respectively to be operated are then selected by means of the control signal transmitter 35 or 55 depending on the bank address bits BAB.

We claim:

1. A RAM memory circuit, comprising:
    at least one memory bank divided into $q \geq 2$ areas and having a multiplicity of memory cells in a matrix of rows and columns, a set of said columns of each area being subdivided into $p \geq 2$ disjoint subsets each defining a segment;
    a dedicated area bus for each area a and a bundle of $m \geq 1$ master data lines for each said segment of each area, said bundle branching from the respective said area bus and being connectible via a line network, controlled by address information, to individually addressed groups of m memory cells each within a respective said segment;
    a data port and an area multiplexer for cyclically connecting said area buses to said data port, said data port having m external terminals for inputting and outputting the data groups to be written in or read out at the addressed said memory cell groups;
    delay or holding devices for simultaneously providing in each case q successive data groups on said q area buses;
    a control device having a control input for receiving a clock signal and being configured to control a write and read operation under an influence of the clock signal and applied address information and command information;
    a data latch coupled to each said master data line bundle for holding a data group respectively appearing at said master data line bundle; and
    an isolating switch between each master data line bundle and the assigned said area bus, said isolating switch being connected to and controlled by said control device, for temporarily decoupling said master data line bundle from the respective said area bus.

2. The RAM memory circuit according to claim 1, wherein said control device comprises:
    a row address decoder for selecting a row of memory cell groups depending on a row address;
    first and second column address decoders, each connected to receive a column address and activatable to address a memory cell group determined by the respective column address within a selected said row; and
    a device for optionally activating only said first column address decoder or only the second column address decoder or both said first and second column address decoders simultaneously.

3. The RAM memory circuit according to claim 2, wherein each column address decoder in said control device is assigned a dedicated address counter, and said dedicated address counter can be activated in order to supply, at a clock rate of the clock signal, a burst of successive column addresses to the relevant said column address decoder, beginning with a start column address determined by the column address information.

4. The RAM memory circuit according to claim 3, wherein:
    said control device is configured to receive a write-read command, for starting a write operation and a read operation following directly afterward; and
    said control device has address terminals for application of a column address simultaneously with a row address or for simultaneous application of two column addresses.

5. The RAM memory circuit according to claim 1, wherein said control device is configured to receive a write command, for starting a write operation, and to receive a read command, for starting a read operation.

6. A method for operating a RAM memory circuit, which comprises:
    providing a RAM memory circuit according to claim 1 and operating the circuit in a write operation for writing in a burst of successive write data groups received at the data port, and in a subsequent read operation for reading out a burst of successive read data groups to the data port, each data group comprising m data in parallel form and each burst being composed of at least one q-tuple of successive data groups;
    for the write operation, causing the control device to effect the following operations:
        a) changing over the area multiplexer at q times a frequency of the clock signal to send, within a respective clock period, the q write data groups of a respective q-tuple from the data port to the q different area buses;
        b) from a time when a first q-tuple of write data groups is ready on the q area buses, switching through in each case simultaneously and temporarily q write data paths successively at intervals equal to the clock period, for connecting q addressed memory cell groups in the q different areas to the master data line bundles of the assigned segments; and
        c) after a last q-tuple of write data groups is ready on the q area buses and before switching-through the last q write data paths, opening the isolating switches at the respective master data line bundles for the duration of this switching-through,
    for the read operation, causing the control device to effect the following operations:
        d) from a time when the isolating switches are opened, switching through in each case simultaneously and temporarily q read data paths successively at intervals equal to the clock period, for connecting q addressed memory cell groups in the q different areas to the master data line bundles of the assigned segments;
        e) as soon as the first q-tuple of data groups read out via the read data paths is ready at the area multiplexer, changing over the area multiplexer at q times the frequency of the clock signal for passing the q data groups of each q-tuple to the data port successively at intervals equal to a $q^{th}$ of the clock period;
    addressing memory cell groups lying in different segments than the q memory cell groups addressed last in the write operation for reading out the first q-tuple of read data groups.

7. The method according to claim 6, which comprises:
    configuring the control device of the RAM memory circuit according to claim 1 to receive a write command, for initiation of the write operation, and to receive a read command for initiation of a read operation;
    providing the row address prior to the initiation of the write operation;
    for the initiation of the write operation, applying the write command and providing the column address for the first q-tuple of write data groups; and for the initiation of the read operation, applying the read command and providing the column address for the first q-tuple of read data groups.

8. The method according to claim 6, which comprises:

configuring the control device of the RAM memory circuit to receive a write-read command for starting a write operation and a read operation following directly afterward, and providing the control device with address terminals for application of a column address simultaneously with a row address or for simultaneous application of two column addresses;

providing the row address before an initiation of the write operation;

for the initiation of the write operation, applying the write-read command;

providing one of the start column addresses for the write-read operation upon the initiation of the write operation and providing another one of the start column addresses likewise upon the initiation of the write operation or together with the row address.

9. The method according to claim 8, which comprises providing the start column address for the write operation together with the start column address for the read operation.

10. The method according to claim 8, which comprises providing the start column address for the write operation together with the row address.

* * * * *